United States Patent
Sakaidani

(10) Patent No.: US 7,953,234 B2
(45) Date of Patent: May 31, 2011

(54) AUDIO SIGNAL OUTPUT CIRCUIT AND ELECTRONIC APPARATUS OUTPUTTING AUDIO SIGNAL

(75) Inventor: Satoshi Sakaidani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1409 days.

(21) Appl. No.: 11/232,286

(22) Filed: Sep. 21, 2005

(65) Prior Publication Data

US 2006/0013413 A1 Jan. 19, 2006

(30) Foreign Application Priority Data

Oct. 7, 2004 (JP) ................................. 2004-295414

(51) Int. Cl.
*H03G 3/00* (2006.01)
*H04B 15/00* (2006.01)
(52) U.S. Cl. .......................... 381/104; 381/94.5; 330/10
(58) Field of Classification Search .................. 381/94.5, 381/104, 107; 330/10
See application file for complete search history.

(56) References Cited

U.S. PATENT DOCUMENTS

| | | | | |
|---|---|---|---|---|
| 6,459,219 B1* | 10/2002 | Antheunes et al. | ........... | 315/370 |
| 6,628,999 B1* | 9/2003 | Klaas et al. | ..................... | 700/94 |
| 2004/0130472 A1 | 7/2004 | Arizumi et al. | | |
| 2005/0083115 A1* | 4/2005 | Risbo | .............................. | 330/10 |
| 2005/0122162 A1* | 6/2005 | Ishizaki | .......................... | 330/10 |

FOREIGN PATENT DOCUMENTS

| | | |
|---|---|---|
| JP | 05-055924 A | 3/1993 |
| JP | 09-270640 A | 10/1997 |
| JP | 2003-258559 | 9/2003 |
| JP | 2004-222251 A | 8/2004 |

* cited by examiner

*Primary Examiner* — Vivian Chin
*Assistant Examiner* — Paul Kim
(74) *Attorney, Agent, or Firm* — Keating & Bennett, LLP

(57) ABSTRACT

A digital audio-signal output circuit is provided, which is capable of outputting an audio signal without generating pop noise. In suppressing pop noise, the audio signal output circuit requires no analog circuit nor mute control signal for external peripheral devices. Upon receipt of a digital input audio signal having an AC component superposed on a reference voltage VREF, the circuit selects one of a pulse-density-modulated audio signal derived from the input audio signal and a transition signal that smoothly varies between zero volt and the reference voltage, and provides the selected signal to speakers.

10 Claims, 10 Drawing Sheets

16
AUDIO SIGNAL OUTPUT CIRCUIT AND ELECTRONIC APPARATUS OUTPUTTING AUDIO SIGNAL

FIELD OF THE INVENTION

This invention relates to an audio signal output circuit capable of outputting audio signal with suppressed "pop" noise (or pop sound) generated at the power-on and -off of the circuit, and to an electronic apparatus utilizing such audio signal output circuit.

BACKGROUND OF THE INVENTION

There have been disclosed a variety of audio signal output circuits adapted to prevent generation of pop noise that occurs at the time of power-on and power-off of an audio output amplifier.

For example, Japanese Patent Application Laid Open No. 2003-258559 (referred to as Document 1) discloses a circuit having a drive amplifier, a coupling capacitor, and a changeover switch for switching the connection of the coupling capacitor to a speaker or to the ground in response to a mute signal received. As a consequence, the signal-flow path to the speaker is shut down and at the same time the coupling capacitor is rapidly charged or discharged to prevent pop noise from occurring.

Thus, the prior art circuit as disclosed in Document 1 disadvantageously requires many such components as coupling capacitor and changeover switch in a later stage of the audio signal output circuit, in addition to a mute signal generator for controlling the switch, which is a drawback in constructing the circuit in the form of an IC.

SUMMARY OF THE INVENTION

It is, therefore, an object of the present invention to provide a digital audio signal output circuit capable of preventing pop noise from occurring, without using any analog circuit or mute control signal for external devices.

It is another object of the invention to provide an electronic apparatus having such audio signal output circuit and speakers that can be connected directly, or indirectly via a low-pass filter, to the output terminals of the audio signal output circuit.

An inventive audio signal output circuit may comprise:
- a volume setting circuit 20 receiving a digital input audio signal having an AC component superposed on a given reference voltage VREF, the volume setting circuit adapted to amplify the AC component with an amplification rate that varies from a predetermined level to zero, or from zero to the predetermined level, in accordance with a mute/release mute signal MUT received;
- a modulator (such as a delta sigma modulator) 30 for performing pulse density modulation on the audio signal received from the volume setting circuit 20;
- a transition signal generation circuit 40 for generating a pulse-density-modulated transition signal TRS in response to a reset signal RES associated with the mute/release mute signal MUT, the transition signal TRS varying in level from the reference voltage VREF to zero volt (or ground potential) or from zero volt to the reference voltage;
- a switching circuit 50 for selecting either one of the audio signal received from the modulator 30 and the transition signal received from the transition signal generation circuit 40 according to a switching signal COS received, and feeding the selected signal to an electro-acoustic transducing apparatus; and
- a control circuit 60 for generating a control signal that includes the mute/release mute signal, reset signal, and switching signal, wherein
  in switching the audio signal output circuit from a sound reproducing mode to a power-off mode or mute mode, the output level of the audio signal of the modulator 30 is varied to the reference voltage VREF and the switching circuit 50 is subsequently switched to the transition signal having the reference voltage VREF, and then the level of the transition signal is varied from the reference voltage VREF towards zero volt, while
  in switching the audio signal output circuit from power-off mode or mute mode to a sound reproducing mode, the output level of the transition signal is varied from zero volt to the reference voltage VREF and then the switching circuit 50 is switched from the transition signal received from the transition signal generation circuit 40 to the audio signal having the reference voltage VREF.

In the audio signal output circuit of the invention, the electro-acoustic transducing apparatus may have a first and a second electro-acoustic transducers 81 and 82, respectively;
the modulator 30 may be adapted to output pulse-density-modulated first and second audio signals;
the switching circuit 50 may have
a first switch 51 for selecting either one of the first audio signal and the transition signal received from the transition signal generation circuit 40, according to the switching signal COS received, and feeding the selected signal to a first electro-acoustic transducer 81, and
a second switch 52 for selecting either one of the second audio signal and the transition signal received from the transition signal generation circuit 40, according to the switching signal COS received, and feeding the selected signal to a second electro-acoustic transducer 82.

In the audio signal output circuit of the invention, the electro-acoustic transducing apparatus may have at least one electro-acoustic transducer 81;
the switching circuit 50 may have
a first switch for selecting either one of the audio signal received from the modulator 30 and the transition signal received from the transition signal generation circuit 40, according to the switching signal COS received, and feeding the selected signal to one end of the at least one electro-acoustic transducer 81, and
a second switch for selecting either one of the inverted audio signal obtained by inverting the audio signal and the transition signal received from the transition signal generation circuit, according to the switching signal COS received, and feeding the selected signal to the other end of the at least one electro-acoustic transducer 81.

In the audio signal output circuit of the invention, the electro-acoustic transducing apparatus has a first and a second electro-acoustic transducers 81 and 82, respectively;
the modulator 30 may be adapted to output pulse-density-modulated first and second audio signals;
the switching circuit 50 may have
a first switch 51 for selecting either one of the first audio signal and the transition signal received from the transition signal generation circuit 40, according to the switching signal COS received, and feeding the selected signal to one end of the first electro-acoustic transducer 81, and a third switch 53 for selecting either one of the third audio signal obtained by inverting the first audio signal and the transition signal received from the transition signal generation circuit 40, according to the switching signal COS received, and feeding the selected signal to the other end of the first electro-acoustic transducer 81, a second switch 52 for selecting either one of the second audio signal and the transition signal received from the transition signal generation circuit, according to the switching signal COS received, and feeding the selected signal to one end of the second electro-acoustic transducer 82, and a fourth switch 54 for selecting either one of the fourth audio signal obtained by inverting the second audio signal and the transition signal received from the transition signal generation circuit, according to the switching signal COS received, and feeding the selected signal to the other end of the second electro-acoustic transducer 82.

In the audio signal output circuit of the invention, the electro-acoustic transducing apparatus may have a first and a second electro-acoustic transducers 81 and 82, respectively;

the modulator 30 may be adapted to output pulse-density-modulated first and second audio signals;

the switching circuit 50 may have a first switch 51 for selecting either one of the first audio signal and the transition signal received from the transition signal generation circuit 40, according to the switching signal COS received, and feeding the selected signal to one end of a first electro-acoustic transducer 81, and a second switch 52 for selecting either one of the second audio signal and the transition signals received from the transition signal generation circuit 40, according to the switching signal COS received, and feeding the selected signal to one end of a second electro-acoustic transducer 82, wherein the transition signal is supplied from the transition signal generation circuit to the serial node of the other end of the first electro-acoustic transducer 81 and the other end of the second electro-acoustic transducer 82.

In the audio signal output circuit of the invention, the transition signal generation circuit 40 may have a transition signal waveform generation circuit 41 for generating a digitized waveform that varies in magnitude from a reference voltage VREF to zero volt, or from the zero volt to the reference voltage VREF, and a transition signal pulse-density modulator 42 for converting the digital signal received from the transition signal waveform generation circuit 41 into a pulse-density-modulated transition signal.

In the audio signal output circuit of the invention, the transition signal generation circuit 40 has a memory for storing a waveform that varies in magnitude from the reference voltage VREF to zero volt, or from zero volt to the reference voltage VREF, wherein the waveform stored in the memory 43 is available as a pulse-density-modulated transition signal.

An electronic apparatus of the invention may comprise:
any of the audio signal output circuit as described above; and
an electro-acoustic transducing apparatus that has a first electro-acoustic transducer and/or a second electro-acoustic transducer each connected to the output end of the audio signal output circuit directly or indirectly via a low-pass filter.

An electronic apparatus of the invention may comprise:
an audio signal output circuit receiving a digital input audio signal having an AC component superposed on a DC component (reference voltage); and
an electro-acoustic transducing apparatus that has a first electro-acoustic transducer and/or a second electro-acoustic transducer each connected to the output end of the audio signal output circuit directly or indirectly via a low-pass filter, wherein the audio signal output circuit has muting means for executing muting in response to a mute/release mute signal, in which the amplification rate of the audio signal output circuit for the AC component is decreased from a predetermined level to zero in accord with a given mute setting;

switch means for executing system-reset and switching the output of the audio signal output circuit from the input audio signal to a transition signal having the reference voltage when the muting is completed and the level of the AC component is detected to have reached to zero volt;

first transition signal generation means for generating a transition signal that decreases in level from the reference voltage to zero volt; and power-off means for turning off power to the audio signal output circuit when generation of the transition signal is completed and a determination is made that the level of the transition signal has reached to zero volt, and whereby the means are sequentially put in operation to make the audio signal output circuit undergo a transition from an audio signal reproducing mode to the power-off mode with suppressed pop noise.

An electronic apparatus of the invention may comprise:
an audio signal output circuit receiving a digital input audio signal having an AC component superposed on a DC component (reference voltage); and
an electro-acoustic transducing apparatus that has a first electro-acoustic transducer and/or a second electro-acoustic transducer each connected to the output end of the audio signal output circuit directly or indirectly via a low-pass filter, wherein the audio signal output circuit has:
transition enabling means for feeding power to the audio signal output circuit in power-off mode to output a transition signal of initially zero volt;

system-reset release means for releasing the system-reset of the apparatus prior to feeding power;

second transition signal generation means for generating a transition signal that increases in level from zero volt to the reference voltage;

switch means for switching the output of the audio signal output circuit from the transition signal having the reference voltage to a muted audio signal when generation of the second transition signal is completed and the transition signal is detected to have reached the reference voltage; and release mute means for setting the audio signal output circuit to release mute mode after switching the output of the circuit to an audio signal, and then increasing the amplification rate of the audio signal output circuit for the AC component from zero to a predetermined value, whereby the means are sequentially put in operation to make the audio signal output circuit undergo a transition from an audio signal reproducing mode to the power-off mode with suppressed pop noise.

According to the invention, an audio signal output circuit can be solely constituted of digital circuits without involving any analog circuit so that no pop noise will be generated when it is connected to an electro-acoustic transducer (speaker) directly or indirectly via a low-pass filter. Thus, the audio signal output circuit can be easily integrated in an IC (or LSI).

As stated above, the output volume level of an digital input audio signal (of 16-bits for example) is controlled during a power-on and a power-off period such that the amplification rate for the AC component of the input audio signal is varied from a predetermined value or from zero to the predetermined value in response to a mute/release mute signal. The volume-controlled digital audio signal is pulse-density modulated by a modulator, so that the digital-to-audio conversion of the signal can be easily performed by dedicated low-pass filters (LPFs), or in some cases by speakers themselves.

It is noted that the transition signal generation circuit generates a digital (e.g., 16-bit) signal having a digitized waveform that varies in magnitude from a reference voltage to zero volt or from zero volt to the reference voltage, and converts the digitized waveform into a pulse-density-modulated transition signal. Thus, an arbitrary waveform of transition signal can be easily obtained.

It is also noted that the transition signal generation circuit has a memory (such as a ROM) for storing a digitized waveform that varies from zero volt to the reference voltage, and outputs the stored waveform as a pulse-density-modulated transition signal. Thus, by controlling the speed and directions of reading the stored waveform, various waveforms having different rising and falling patterns can be provided. In addition, modification of a waveform is easy.

The transition time of a transition signal can be made extremely short (theoretically zero) by equalizing the voltages applied to the opposite ends of each speaker during switching of the switching circuit. In this case, the transition time can be shortened to less than several hundreds milliseconds, possibly to several milliseconds. It is noted that establishing good timing of the transition signal would be difficult if the transition signal were analog, since an analog transition signal would be formed by a capacitor and a resistor. In contrast, the invention digitally forms the transition signal (or transition waveform) to attain an extremely short transition time that cannot be attained by analog transition signals.

The inventive audio signal output circuit can be implemented in computer software when the circuit is for use in an electronic apparatus. Therefore, a general purpose computer installed in an electronic apparatus can be used to implement the audio signal output circuit according to the invention, thereby simplifying the overall structure of the electronic apparatus.

DETAILED DESCRIPTION OF THE PREFERRED EMBODIMENTS

An audio signal output circuit according to the invention and an electronic apparatus adapted to generate an audio output will now be described in detail by way of example with reference to the accompanying drawings. Incidentally, the audio signal output circuit of the invention may be fabricated in an LSI, and thus it may be considered as a semiconductor device.

Figure 1:
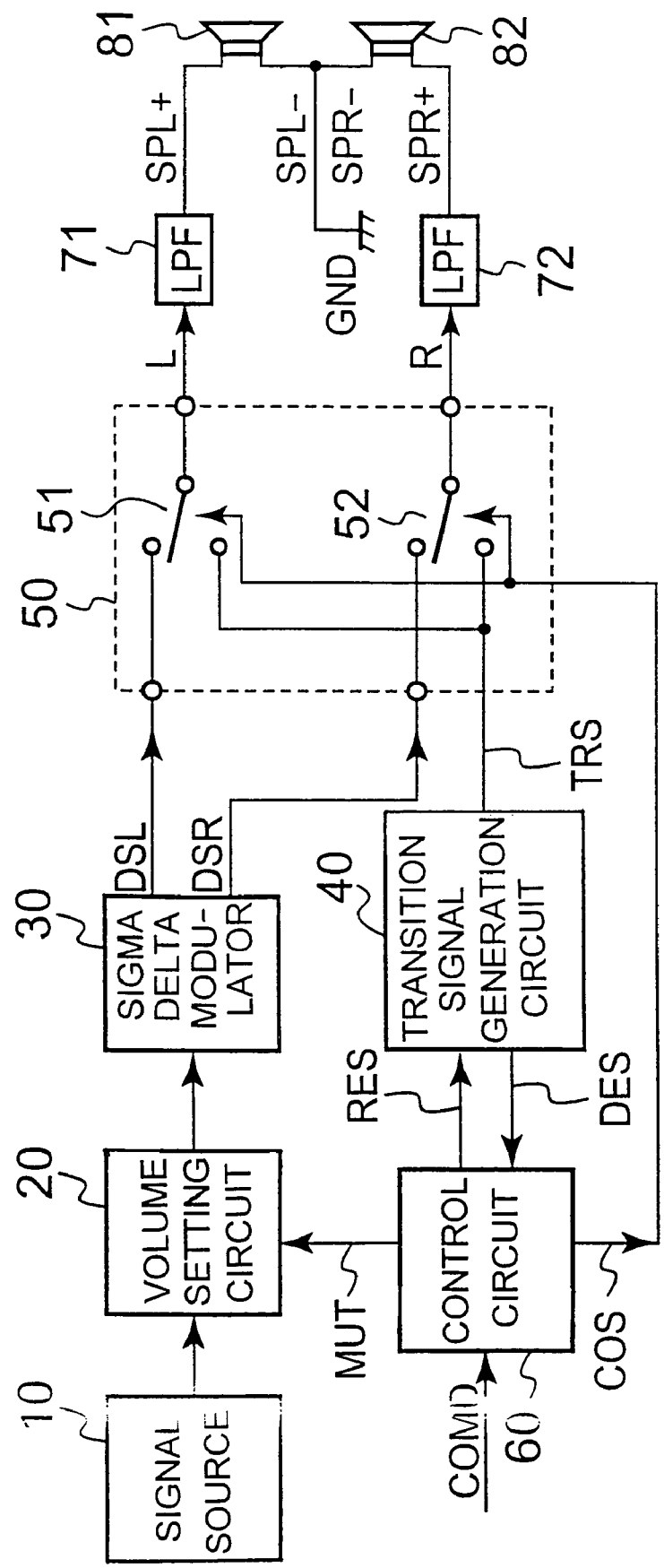
FIG. 1 shows an arrangement of an audio signal output circuit according to a first embodiment of the invention, along with the arrangement of an electronic apparatus utilizing the audio signal output circuit.
Figure 2:
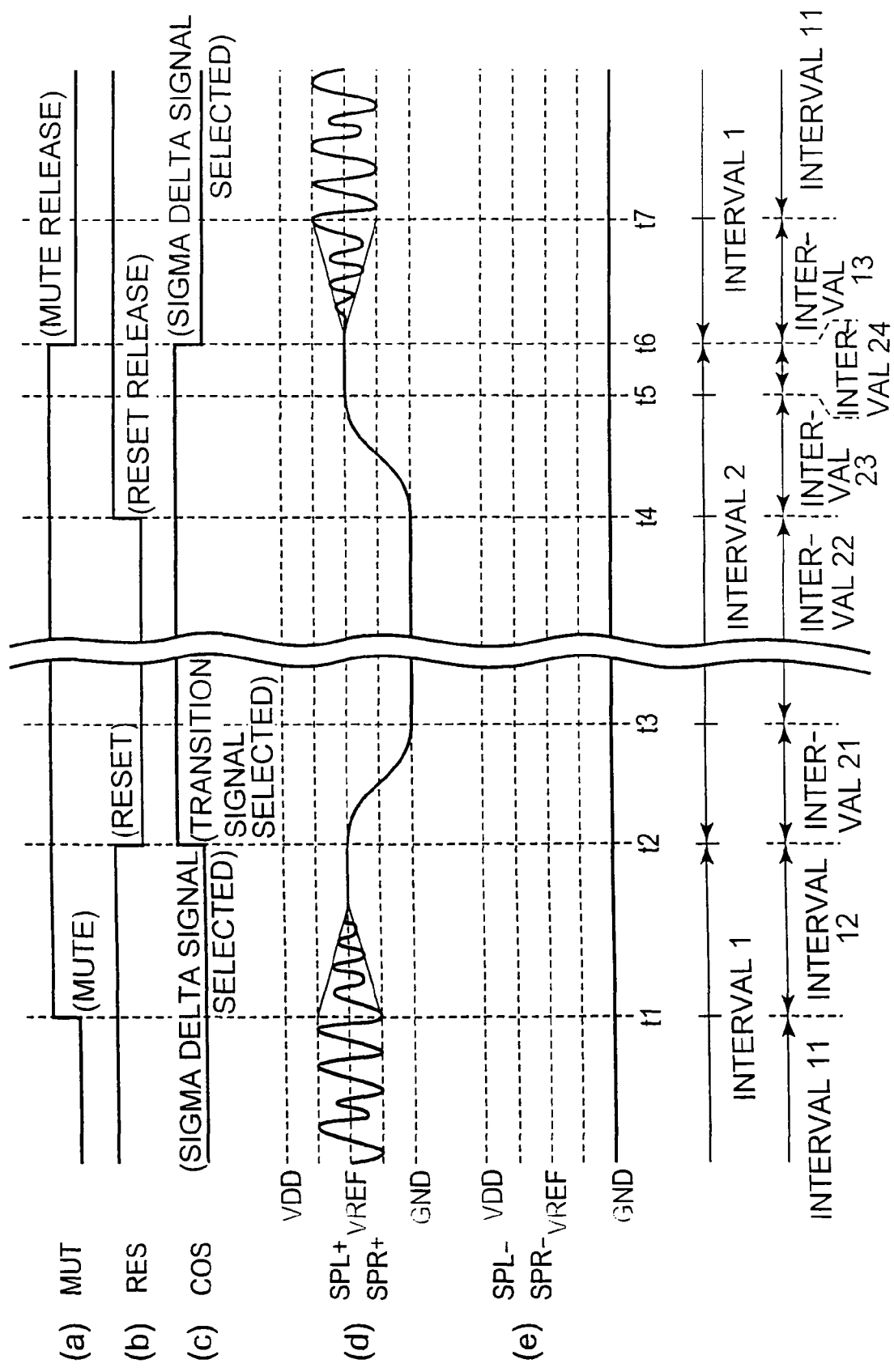
FIG. 2 shows a timing diagram illustrating operation of the audio signal output circuit of FIG. 1.

Referring to FIG. 1, there is shown an audio signal output circuit according to a first embodiment of the invention, along with an arrangement of an electronic apparatus utilizing the circuit. FIG. 2 is a timing diagram illustrating operation of the audio signal output circuit shown in FIG. 1.

As seen in FIG. 1, an audio signal having an AC component is fed from a signal source 10 to a volume setting circuit 20, the AC component being indicative of voice and superposed on a DC component (referred to as reference voltage VREF) of the input audio signal. This audio signal is a multi-bit (e.g., 16-bit) digital signal. The reference voltage VREF is between a given power supply voltage VDD and the ground voltage GND, preferably an intermediate voltage between the two voltages. The signal source 10 may be provided either within or outside the audio signal output circuit. It should be understood that in what follows voltages are taken with respect to the ground potential GND unless otherwise stated.

The volume setting circuit 20 can regulate the output volume of the audio signal at an arbitrary level. The volume setting circuit 20 regulates the volume of its output. This can be done, in response to a mute/release mute signal MUT received, by varying the amplification rate of the circuit 20 for the AC component of the digital input audio signal from a predetermined level to zero volt or from zero volt to the predetermined level.

If the volume setting circuit 20 receives a mute/release mute signal MUT commanding "MUTE" during an audio reproduction mode, the circuit gradually reduces the AC component and outputs a (digital) audio signal having the reference voltage VREF. On the other hand, if the volume setting circuit 20 receives a mute/release mute signal MUT commanding "RELEASE MUTE" during the "MUTE" mode, the circuit gradually increases the AC component from zero volt to the reference voltage VREF, thereby outputting a (digital) audio signal output having the AC component superposed on the reference voltage VREF.

A delta sigma modulator 30 performs delta-sigma modulation on the audio signal received from the volume setting circuit 20 to convert the audio signal into a pulse-density-modulated signal, the pulse density thereof representing the level of the audio signal. In the example shown herein, the audio signal is a stereo signal that is split by the delta sigma modulator 30 into a first audio signal DSL for the left channel and a second audio signal DSR for the right channel.

A transition signal generation circuit 40 generates a pulse-density-modulated transition signal TRS that varies in level from the reference voltage VREF to zero volt or from zero volt to the reference voltage VREF in accordance with a reset signal RES associated with the mute/release mute signal MUT.

A switching circuit 50 has a first switch 51 and a second switch 52. The first switch 51 selects one of the first audio signal DSL and the transition signal TRS according to the switching signal COS received, and outputs selected signal to a first electro-acoustic transducer (hereinafter referred to as speaker) 81. The second switch 52 selects one of the second audio signal DSR and the transition signal TRS according to the switching signal COS received, and outputs it to a second speaker 82. Both of the first and second audio signal DSL and DSR, respectively, and the transition signal TRS have the reference voltage VREF when switching is made between the first and second switches 51 and 52.

A control circuit 60 generates a control signal that includes a mute/release mute signal MUT, a reset signal RES, and a switching signal COS, upon receipt of a command signal COMD to turn off power to the audio signal output circuit and the electronic apparatus, or to start the audio reproduction mode of the apparatus. The control circuit 60 is supplied with a determination signal DES that the transition signal TRS has reached a predetermined level (reference voltage VREF or zero volt) from the transition signal generation circuit 40.

LPFs 71 and 72 respectively smooth pulse-density-modulated first and second audio signals DSL and DSR and the transition signal TRS received from the switching circuit 50 to generate a first and a second speaker signals SPL+ and SPR+, respectively, that are each supplied to the respective one end of the first and second speakers 81 and 82, respectively. Other ends of the first and second speakers 81 and 82, respectively, are connected to the ground GND.

When the first and second speakers (81 and 82) themselves have a coil, they can collaborate with the LPFs 71 and 72 to smooth the signals DSL and DSR and the transition signal TRS. Thus, if the first and second speakers 81 and 82 themselves can provide sufficient smoothing, the LPFs 71 and 72 may be omitted. In that case, the first and second audio signals DSL and DSR, respectively, and the transition signal TRS are directly fed from the switching circuit 50 to the respective first and second speakers 81 and 82.

The audio signal output circuit that includes the volume setting circuit 20, delta sigma modulator 30, transition signal generation circuit 40, switching circuit 50, and control circuit 60 may be may be constructed in one LSI chip. The audio signal output circuit described above can constitutes an electronic audio apparatus if provided with the first and second external speakers 81 and 82, respectively, and the LPFs 71 and 72.

Figure 3:
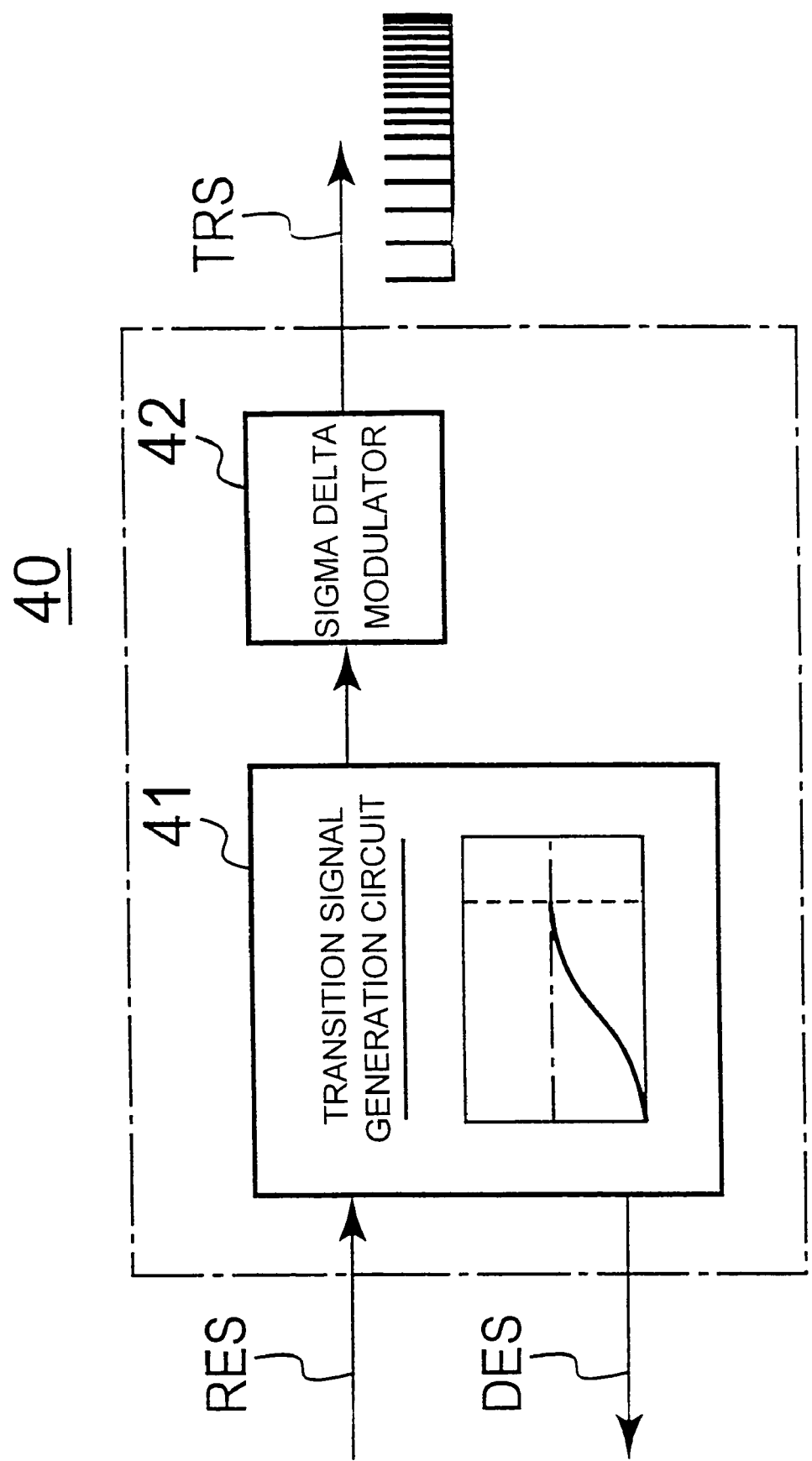
FIG. 3 shows a first arrangement of a transition signal generation circuit of the invention.

Referring to FIG. 3, there is shown a first arrangement of the transition signal generation circuit 40 having a waveform generation circuit 41 and a delta sigma modulator 42.

The transition signal waveform generation circuit 41 generates a first multi-bit (e.g., 16-bit) transition signal waveform that smoothly varies from the reference voltage VREF to zero volt, or a second transition signal waveform that smoothly varies from zero volt to the reference voltage VREF, in response to the reset signal RES received. The transition waveform generation circuit 41 is adapted to generate a determination signal DES when the first transition signal reaches zero volt or when the second transition signal reaches the reference voltage VREF.

The delta sigma modulator 42 performs pulse-density modulation on the first or second transition signal received from the transition signal waveform generation circuit 41 to generate a first or a second pulse-density-modulated transition signal TRS having a pulse density in accord with the level of the first or the second transition signal. FIG. 3 illustrates the transition signal waveform generation circuit currently generating the second pulse-density-modulated transition signal.

Figure 4:
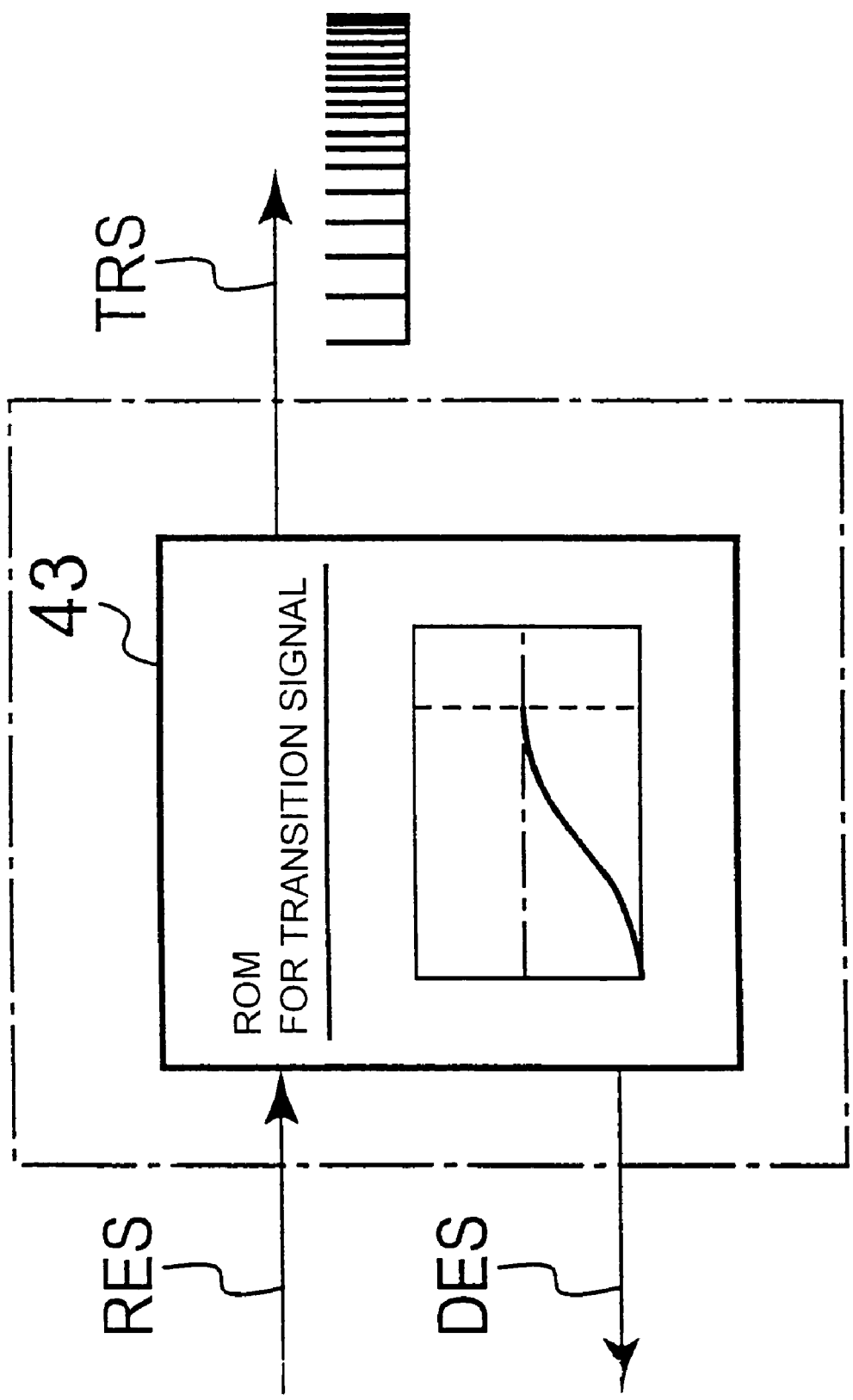
FIG. 4 shows a second arrangement of a transition signal generation circuit of the invention.

Referring to FIG. 4, there is shown a second arrangement of the transition signal generation circuit 40A, which has a ROM 43 for use in generating a pulse-density-modulated transition signal TRS (the ROM referred to as transition signal generating ROM). In response to the reset signal RES received, the transition signal generating ROM 43 provides a first pulse-density-modulated transition signal that varies smoothly from the reference voltage VREF to zero volt, or a second pulse-density-modulated transition signal that varies smoothly from zero volt to the reference voltage VREF, having a pulse density in accord with the level of the first or second transition signal. FIG. 4 illustrates the transition signal generation circuit currently generating the second pulse-density-modulated transition signal.

The transition signal generating ROM 43 can store data (referred to as transition signal data) that smoothly varies in pulse density between a maximum pulse density that corresponds to the reference voltage VREF and a minimum pulse density that corresponds to zero volt. The data stored in the transition signal generation ROM 43 may be retrieved in one direction or another, depending on which of the first transition signal and the second transition signal is generated. Thus, the first and second transition signals can be read out from the same transition signal data stored in the ROM 43. It should be understood, however, that two types of transition signal data for generating the first and second transition signals can be individually stored in the ROM 43.

Referring to the timing diagram of FIG. 2, operation of an audio signal output circuit according to a first embodiment of the invention will now be described below.

First, power-off operation on the audio signal output circuit in the audio reproduction mode will be described. Up to time t1 (interval 11), mute/release mute signal MUT is in "RELEASE MUTE" state as shown in FIG. 2(a), while the reset signal RES is in "RESET RELEASE" state as shown in FIG. 2(b), the switching signal COS in "SELECT DELTA SIGMA SIGNALS" state (for selection of audio signal) as shown in FIG. 2(c). As seen in FIG. 2(d), the output signal of the volume setting circuit 20 then contains an AC component (AC voltage) superposed on the reference voltage VREF.

The audio signal outputted from the volume setting circuit 20 is eventually supplied as the first and second speaker signals SPL+ and SPR+ to respective one end of the first speaker 81 and the second speaker 82 via the delta sigma modulator 30, switching circuit 50, and LPFs 71 and 72. In the example shown herein, other ends of the first and second speakers 81 and 82, respectively, are connected to the ground GND as shown in FIG. 2 (e), thereby holding the voltages SPL− and SPR− of these ends at zero volt at all times.

If the control circuit 60 is fed with a command signal COMD to turn off power at time t1, the mute/release mute signal MUT is set to "MUTE" state. As a consequence, the volume setting circuit 20 smoothly decreases its amplification rate for the AC component from the current amplification rate to zero. Suppose that the reset signal RES assumes "RESET" state at time t2 sometime after the AC component has decreased to zero. Then the switching signal COS assumes "SELECT TRANSITION SIGNAL" state, and the switching circuit 50 selects the transition signal TRS.

At this point of time t2, the transition signal TRS has the reference voltage VREF, so that the switching circuit 50 may be switched without generating any abrupt change or "shock" in the audio signal. It should be noted that even if a little voltage differences exists between the reference voltage VREF of the transition signal TRS and the reference voltage VREF of the delta sigma signals, it will be absorbed by the LPFs 71 and 72, thereby resulting in no pop noise. The time interval 1 up to time t2 is a period to SELECT DELTA SIGMA SIGNALS, and the time interval 12 from time t1 to time t2 is a period in which the AC component of the audio signal is converged to zero volt.

After time t2, the transition signal TRS smoothly decreases from the reference voltage VREF to zero volt over a predetermined period of time (interval 21 from t2 to t3). The length of the interval 21 (t2-t3) and the waveform of the transition signal TRS can be arbitrary so long as no pop noise is heard from the speakers 81 and 82. The fact that the transition signal TRS has become zero at time t3 can be confirmed by the determination signal DES delivered to the control circuit 60.

After time t3 (and up until time t4) the speakers 81 and 82 are not supplied with any voltage, so that no pop noise will be generated and power can be turned off any time.

Next, a procedure for transforming the power-off mode into the audio reproduction mode will now be described. Suppose now that the audio signal output circuit is in the power-off mode in the time interval 22 (up to time t4). In other words, the mute/release mute signal MUT is in "MUTE" state as shown in FIG. 2 (a), the reset signal RES in the "RESET" state as shown in FIG. 2 (b), the switching signal COS in "SELECT TRANSITION SIGNAL" state as shown in FIG. 2 (c), and the first and second speaker signals SPL+ and SPR+, respectively, have zero volt. Therefore, no pop noise is generated if power is turned on.

As the reset signal RES is released (to assume "RESET RELEASE" state) at time t4, the transition signal generation circuit 40 causes the transition signal TRS to smoothly increase from zero volt to the reference voltage VREF over a predetermined time interval 23 from (t4 to t5). The length of this period (t4-t5) and the waveform of the transition signal TRS during this period are arbitrary, so long as no pop noise is outputted from the speakers 81 and 82.

The fact that the transition signal TRS has reached the reference voltage VREF at time t5 is informed by a determination signal DES to the control circuit 60. At time t6, an appropriate period (interval 24) after time t5, the mute/release mute signal MUT assumes "RELEASE MUTE" state, and the switching signal COS assumes "SELECT DELTA SIGMA SIGNALS" state. That is, the switching signal COS assumes "SELECT TRANSITION SIGNAL" state for the interval 2 from time t2 to time t6.

At time t6, the switching circuit 50 switches the transition signal to the delta sigma signals (i.e. first and second audio signals) without causing any shock, since the delta sigma signals have the reference voltage VREF. Additionally, since the mute/release mute signal MUT assumes "RELEASE MUTE" state at time t6, the volume setting circuit 20 can smoothly increases the amplification rate for the AC component from zero to a predetermined level over an interval 13 from time t6 to time t7. After time t7 (interval 11), an ordinary audio signal reproduction state is realized. Incidentally, in the period after time t6 (interval 1), the switching signal COS assumes "SELECT DELTA SIGMA SIGNALS" state again.

In the example shown in FIG. 1, the speaker 82 can be omitted. In that case, the LPF 72 and the second switch 52 are not required.

Thus, according to the first embodiment of the invention above, the audio signal output circuit can be switched between the audio reproduction mode and power-off mode without generating pop noise.

It would be appreciated that, since the audio signal output circuit can be implemented solely in the form of a digital circuit, the circuit can be easily integrated in an LSI.

In the invention, given a digital input audio signal (of 16-bits for example), the amplification rate for the AC component of the input audio signal is decreased from a predetermined level to zero, or from zero to the predetermined level, in response to a mute/release mute signal to thereby control the output volume level of the audio signal, and in addition the volume controlled audio signal is pulse-density-modulated by a delta sigma modulator prior to outputting the audio signal. Hence, the digital-to-analog (AD) conversion can be easily performed by the LPfs or by the speakers themselves if desired.

It will be recalled that the transition signal generation circuit 40 generates a digital (e.g. 16-bit) waveform that varies from the reference voltage VREF to zero volt or from zero volt to the reference voltage VREF, and converts the digital transition signal into a pulse-density-modulated transition signal, which enables easy formation of an arbitrary waveform of the transition signal.

It will be also recalled that the transition signal generation circuit 40 has the ROM 43 for storing the digital waveform that varies between the reference voltage VREF and zero volt, and that the ROM 43 provides the stored waveform as a pulse-density-modulated transition signal TRS. Thus, varied waveforms having different rising and/or falling patterns can be provided by controlling the speed and direction of reading the stored waveform.

Figure 5:
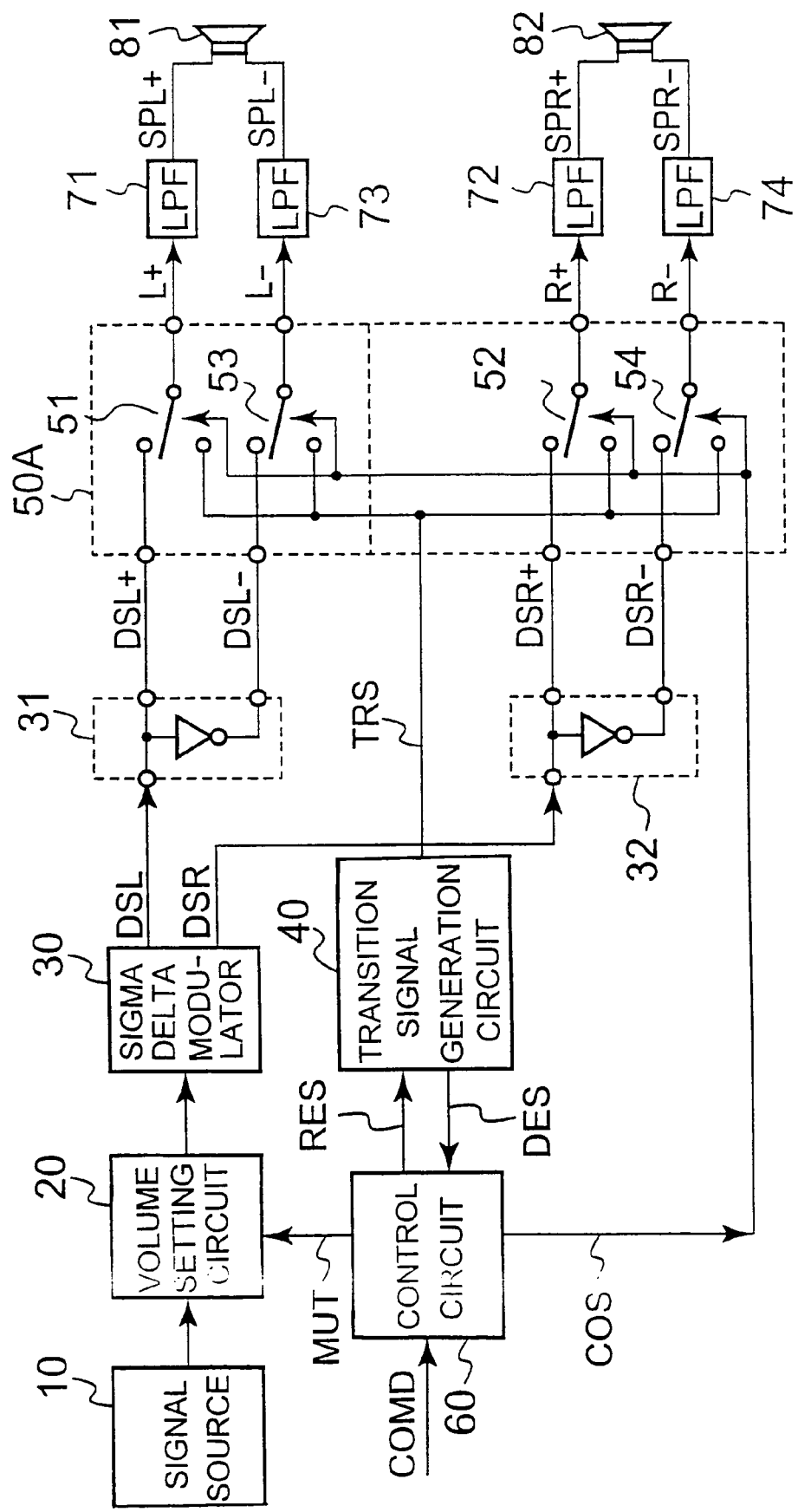
FIG. 5 shows an audio signal output circuit according to a second embodiment of the invention, and an arrangement of an electronic apparatus utilizing the circuit.
Figure 6:
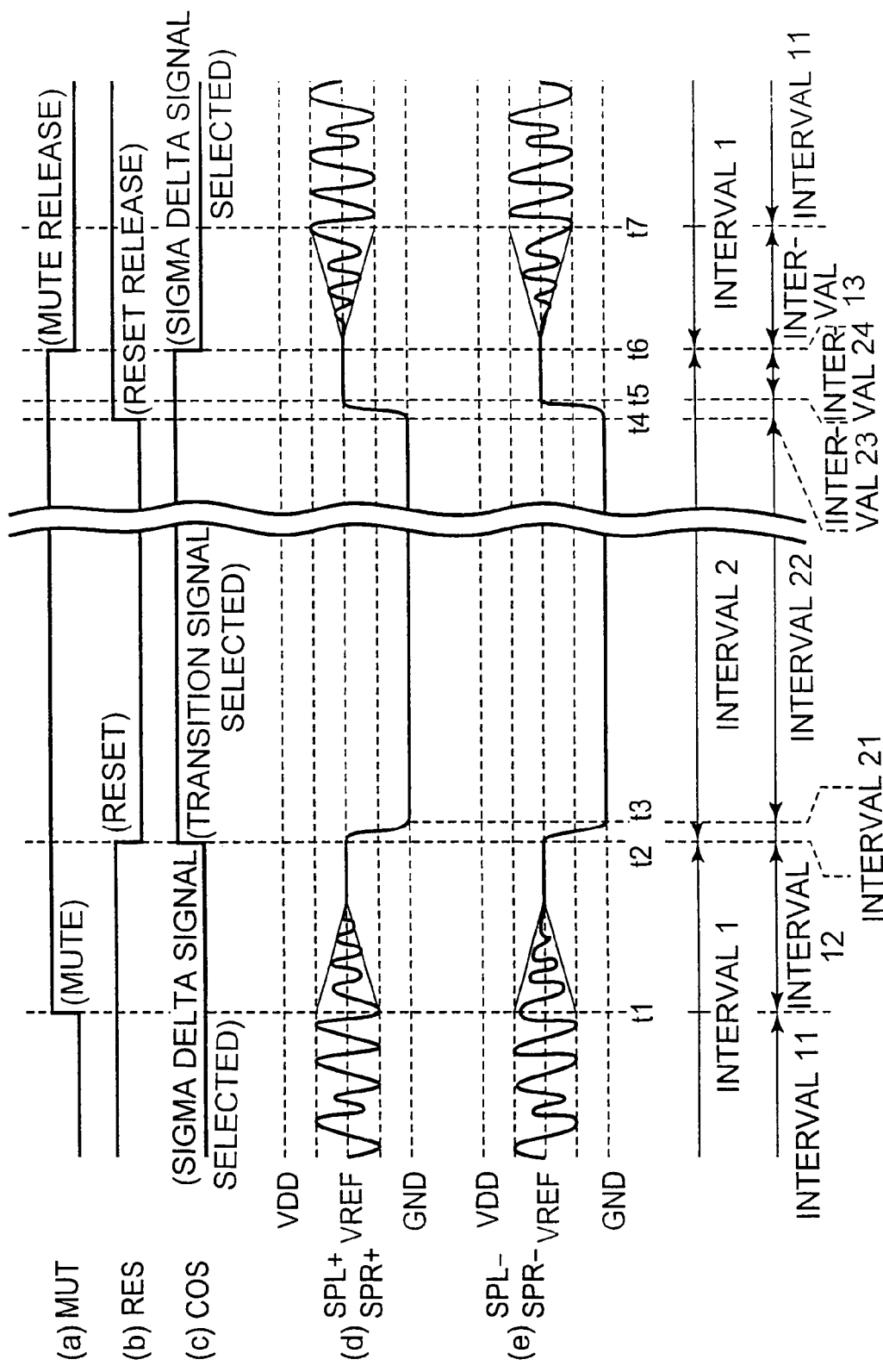
FIG. 6 shows a timing diagram illustrating operation of the circuit of FIG. 5.

Referring to FIG. 5, there is shown an arrangement of an audio signal output circuit according to a second embodiment of the invention, along with an electronic apparatus utilizing the output circuit. FIG. 6 is a timing diagram illustrating operation of the circuit shown in FIG. 5.

The second embodiment has substantially the same power-off and power-on sequences as the first embodiment shown in FIGS. 1 and 2. The second embodiment differs from the first in that the speakers (loads) are driven in a differential voltage scheme, and, the differential signals are supplied to the loads out of phase by 180 degrees when the loads are driven by delta sigma signals, while transition signal is supplied to the loads in phase when stopping the loads.

The signal source 10, volume setting circuit 20, delta sigma modulator 30, transition signal generation circuit 40, and control circuit 60 of FIG. 5 are the same as the elements having the same reference numerals in FIG. 1.

An inverted signal generation circuit 31 is fed with the first audio signal DSL for left channel outputted from the delta sigma modulator 30, and outputs a non-inverted signal DSL+ and an inverted signal DSL−. An inverted signal generation circuit 32 is fed with the second audio signal DSR for right channel outputted from the delta sigma modulator 30, and outputs a non-inverted signal DSR+ and an inverted signal DSR−. Each of the inverted signal generation circuits 31 and 32 can be easily formed by an inversion circuit, since the first and second audio signals DSL and DSR, respectively, are pulse-density-modulated.

The switching circuit 50A includes:

a first switch 51 for selecting one of the non-inverted signal DSL+ of the first audio signal DSL and the transition signal TRS according to the switching signal COS received, and outputs the selected signal to one end of the first speaker 81 via the LPF 71;

a third switch 53 for selecting one of the inverted signal DSL− of the first audio signal DSL and the transition signal TRS according to the switching signal COS received, and outputs the selected signal to the other end of the first speaker 81 via an LPF 73, a second switch 52 for selecting one of the non-inverted signal DSR+ of the second audio signal DSR and the transition signal TRS according to the switching signal COS received, and outputs the selected signal to one end of the second speaker 82 via an LPF 72; and a fourth switch 54 for selecting one of the inverted signal DSR− of the second audio signal DSR and the transition signal TRS according to the switching signal COS received, and outputs the selected signal to the other end of the second speaker 82 via an LPF 74.

The LPF 71, first speaker 81, and LPF 73 are connected in series between the output end of the first switch 51 and the output end of the third switch 53. The LPF 72, second speaker 82, and LPF 74 are connected in series between the output end of the second switch 52 and the output end of the fourth switch 54.

In the second embodiment, in the audio reproduction mode before time t1, the first audio signal DSL having an AC component superposed on the reference voltage VREF is inputted as the inverted first speaker signal SPL+ to one end of the first speaker 81 via the first switch 51 and LPF 71, as shown in FIG. 6(d). On the other hand, the first audio signal DSL having the AC component superposed on the reference voltage VREF is inverted by the inverted signal generation circuit 31 before it is supplied as the inverted first speaker signal SPL− to the other end of the first speaker 81 via the third switch 53 and LPF 73, as shown in FIG. 6(e).

Thus, the audio signal supplied to the first speaker 81 has large amplitude, since the first speaker signal SPL+ and the inverted first speaker signal SPL− are in opposite phase.

Similarly, the audio signal supplied to the second speaker 82 has a large amplitude, since the second speaker signal SPR+ and the inverted second speaker signal SPR− are opposite in phase. Further description of the audio signal supplied to the second speaker 82 will be omitted, since the signal is supplied in the same way as to the first speaker.

As seen in FIG. 6, the AC component of the first audio signal DSL will be decreased to zero by time t2, thereby converging the first audio signal DSL to the reference voltage VREF (digital). When the level of the first audio signal DSL is equal to the reference voltage VREF, the first audio signal DSL is a pulse train having a duty ratio of 50%, so that the duty ratios of the non-inverted signal DSL+ and inverted signal DSL− are both 50%. Therefore, both the first speaker signal SPL+ and the inverted first speaker signal SPL−, respectively obtained through inversion of the non-inverted signal DSL+ and inverted signal DSL−, have the reference voltage VREF (analog).

As seen in FIG. 6, at time t2, sometime after the AC component has decreased to zero, the reset signal RES assumes "RESET" state, and the switching signal COS assumes "SELECT TRANSITION SIGNAL" state. The switching circuit 50 then selects the transition signal TRS, in the same manner as described above in connection with FIG. 2.

At time t2, the transition signal TRS has become a pulse train having the reference voltage VREF (digital) and a duty ratio of 50%. In the second embodiment shown, since the transition signal TRS is applied to both of the first switch 51 and the third switch 53, the switching circuit 50 can switch the transition signal to the first switch 51 or to the third switch 53 without causing any shock.

In this example, the voltages at the output ends of the LPFs 71 and 72 remain the same throughout the switching operation of the switching circuit 50. That is, the voltage across the speaker 81 is in theoretically zero volt.

Accordingly, the level of the transition signal TRS can be varied from the reference voltage VREF to zero volt in an extremely short (theoretically zero) time interval 21 from t2 to t3 without generating pop noise.

In the example shown in FIG. 1, the transition signal TRS is smoothly varied from the reference voltage VREF to zero volt GND in the interval 21, which lasts a certain period of time, e.g. hundreds of milliseconds. However, in the second example shown herein, the interval 21 can be theoretically shortened to zero, and in practice shortened to a several milliseconds if variations of characteristics of the components used (in the LPFs 71, 72 etc.) are taken into account. In fact, the interval 21 can be shorten to 1/100 or less than 1/100 of the corresponding interval of the first embodiment.

Similarly, the interval 23 from t4 to t5 for the transition signal TRS to vary from zero volt GND to the reference voltage VREF can be shortened to an extremely short time on the order of several milliseconds. Subsequent operation of the switching circuit 50 can be executed without causing any shock.

The second speaker 82 can be omitted. In that case, the second audio signal DSR, inverted signal generation circuit 32, second and fourth switches 52 and 54, respectively, and LPFs 72 and 74 are not required.

Thus, according to the second embodiment, the voltages applied to the opposite ends of each speaker are equalized, that is, the potential difference across each speaker is zeroed, when the audio signals DSL and DSR are switched over to the transition signal TRS and vise versa. With voltage across each speaker being zero volt, the transition signal TRS is then varied between the reference voltage VREF and zero volt. Thus, switching of the audio output circuit can be performed without generating pop noise and in a markedly short time interval.

Figure 7:
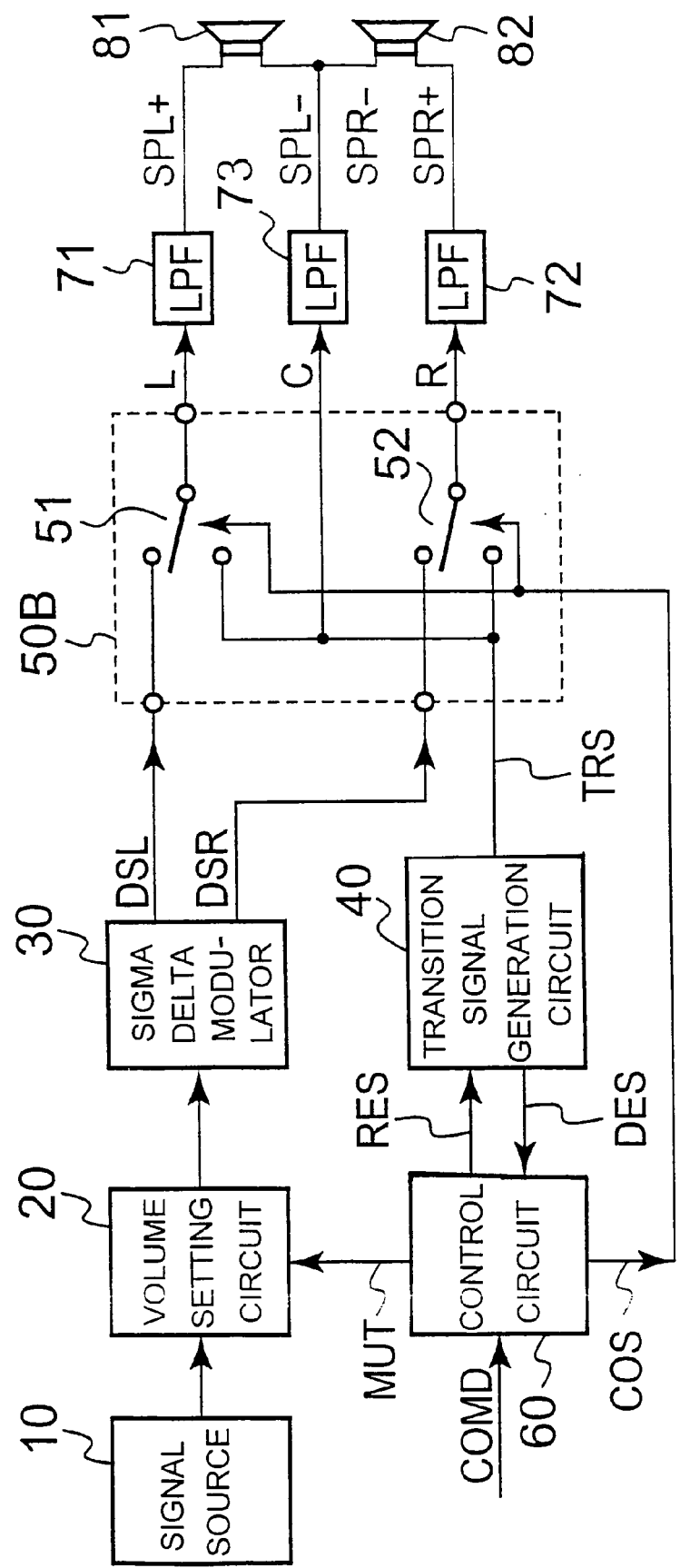
FIG. 7 shows an audio signal output circuit according to a third embodiment of the invention, along with the arrangement of an electronic apparatus utilizing the circuit.
Figure 8:
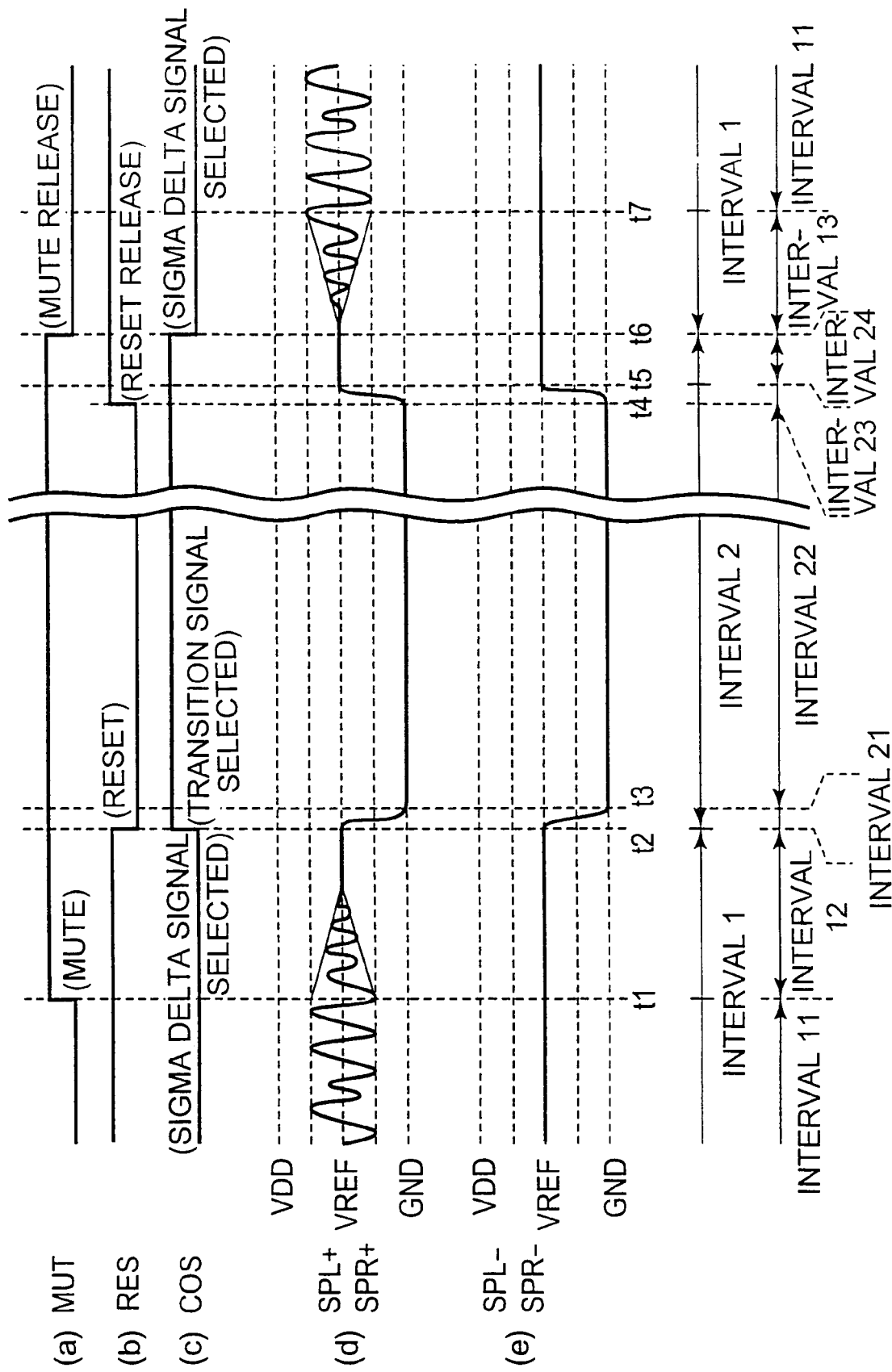
FIG. 8 shows a timing diagram illustrating operation of the circuit of FIG. 7.

Referring to FIG. 7, there is shown an audio signal output circuit according to a third embodiment of the invention along with an electronic apparatus utilizing the output circuit. FIG. 8 is a timing diagram illustrating operation of the circuit shown in FIG. 7.

In the third embodiment shown, power-off and power-on sequences of the audio signal output circuit are substantially the same as those of the first embodiment shown in FIGS. 1 and 2, and of the second embodiment shown in FIGS. 5 and 6. The third embodiment differs from the first and second embodiments in that, when the circuit is in the audio signal output mode outputting an audio signal to the loads (speakers 81 and 82), the first and second audio signals are supplied to respective one end of the speaker 81 and of speaker 82 while the transition signal TRS is supplied to the other ends of the respective speakers 81 and 82, and that the transition signal TRS is supplied in phase to the both ends of each speaker 81 and 82 when the audio signal is switched over to the transition signal TRS.

The signal source 10, volume setting circuit 20, delta sigma modulator 30, transition signal generation circuit 40, and control circuit 60 of FIG. 7 are the same as those of FIG. 1.

The switching circuit 50B has a first switch 51 for selecting one of the first audio signal DSL and the transition signal TRS according to the switching signal COS received and outputs the selected signal to one end of the first speaker 81, and a second switch 52 for selecting one of the second audio signal DSR and the transition signal TRS according to the switching signal COS received and outputs the selected signal to one end of the second speaker 82. The transition signal TRS is always supplied to the node where the other end of the first speaker 81 is connected in series with the other end of the second speaker 82.

In the third embodiment, in the audio reproduction mode prior to time t1, a first audio signal DSL having an AC component superposed on a reference voltage VREF as shown in FIG. 8 (*d*) is supplied to one end of the first speaker 81 as a first speaker signal SPL+ thereto via the first switch 51 and LPF 71. On the other hand, the transition signal TRS having the reference voltage VREF as shown in FIG. 8 (*e*) is directly supplied to the other end of the first speaker 81 as first DC speaker signal SPL− thereto via the LPF 73.

Since the reference voltages VREF of the first speaker signal SPL+ and the first speaker signal SPL− are the same, the first speaker 81 is supplied with the AC component of the audio signal.

Similarly, the second speaker 82 to be driven by the second audio signal DSR is also supplied with the AC component of the audio signal. Further description of the audio signal supplied to the second speaker 82 will be omitted, since the signal is supplied in the same way as to the first speaker.

The AC component of the first audio signal DSL will converge to the reference voltage VREF (digital) by the time t2, as seen in FIG. 8. When the first signal DSL has the reference voltage VREF, the signal DSL is provided in two pulse trains each having a duty ratio of 50%, so that both of the first speaker signal SPL+ and first speaker signal SPL− obtained by smoothing these pulse trains are analog signals having the reference voltage VREF.

As seen in FIG. 8, at time t2, sometime after the AC component has decreased to zero, the reset signal RES assumes "RESET" state, and the switching signal COS assumes "SELECT TRANSITION SIGNAL" state. The switching circuit 50 then selects the transition signal TRS, in the same manner as described above in connection with FIG. 2.

At this moment t2, since both the first audio signal DSL and the transition signal TRS have the same reference voltages VREF, operation of the switching circuit 50 causes no shock in the audio signal.

In this example, the voltages at the output ends of the LPFs 71 and 73 remain the same throughout the switching operation of the switching circuit 50. That is, the voltage across the first speaker 81 is theoretically zero volt.

Accordingly, the level of the transition signal TRS can be varied from the reference voltage VREF to zero volt in an extremely short (theoretically zero) time interval 21 from t2 to t3 without generating pop noise. In fact, in the third embodiment, as in the second embodiment of FIG. 5, the time interval 21 can be shortened to 1/100 or less than 1/100 of the corresponding time interval in the first embodiment. It is noted that the third embodiment can be realized by an easier circuit as compared with the second embodiment.

It is noted that in the first embodiment the DC voltage VREF is applied across each speaker, so that power is consumed by the internal resistances of the speakers. Therefore, it is desirable to provide a capacitor connected in series to each of the speakers for cutting the direct current. On the other hand, in the second and third embodiments, theoretically no DC voltage exists across each speaker, so that no power consumption results. As a consequence, no capacitor for cutting direct current is necessary, which helps minimize the number of external parts.

The transition signal TRS is varied from zero volt to the reference voltage VREF in the time interval 23 from t4 to t5, which interval can be similarly shortened to an extremely short time on the order of several milliseconds. Subsequent switching of the switching circuit 50 can be executed without causing any shock.

The second speaker 82 can be omitted. In that case, the second audio signal DSR, second switch 52, and LPF 72 are not required.

Thus, according to the third embodiment, the voltages applied to the opposite ends of each speaker are equalized, that is, the potential difference across each speaker is zeroed, when the audio signals DSL and DSR are switched over to the transition signal TRS and vise versa. With the voltage across each speaker being zero volt, the transition signal TRS is varied between the reference voltage VREF and zero volt. Thus, switching of the audio output circuit can be performed without generating pop noise and in a markedly short time interval.

Although the invention has been described above with reference to a monaural (single-channel) and a stereo (two-channel) output circuits, it will be apparent to a person skilled in the art that the invention is not limited to these examples and is applicable to other multi (N)-channel circuits such as a 3-channel system and a 5.1-channel surround audio system (utilizing five speakers). It will be understood that in such multi (N)-channel output circuits not only the required number (N) of speakers but also a delta sigma modulator adapted to output N-channel audio signals DS as well as N switches and N LPFs be provided.

Although the audio signal output circuits of the first through third embodiments have been implemented by the circuits 20-60, the audio signal output circuits can be also implemented by computer software, as described below.

Figure 9:
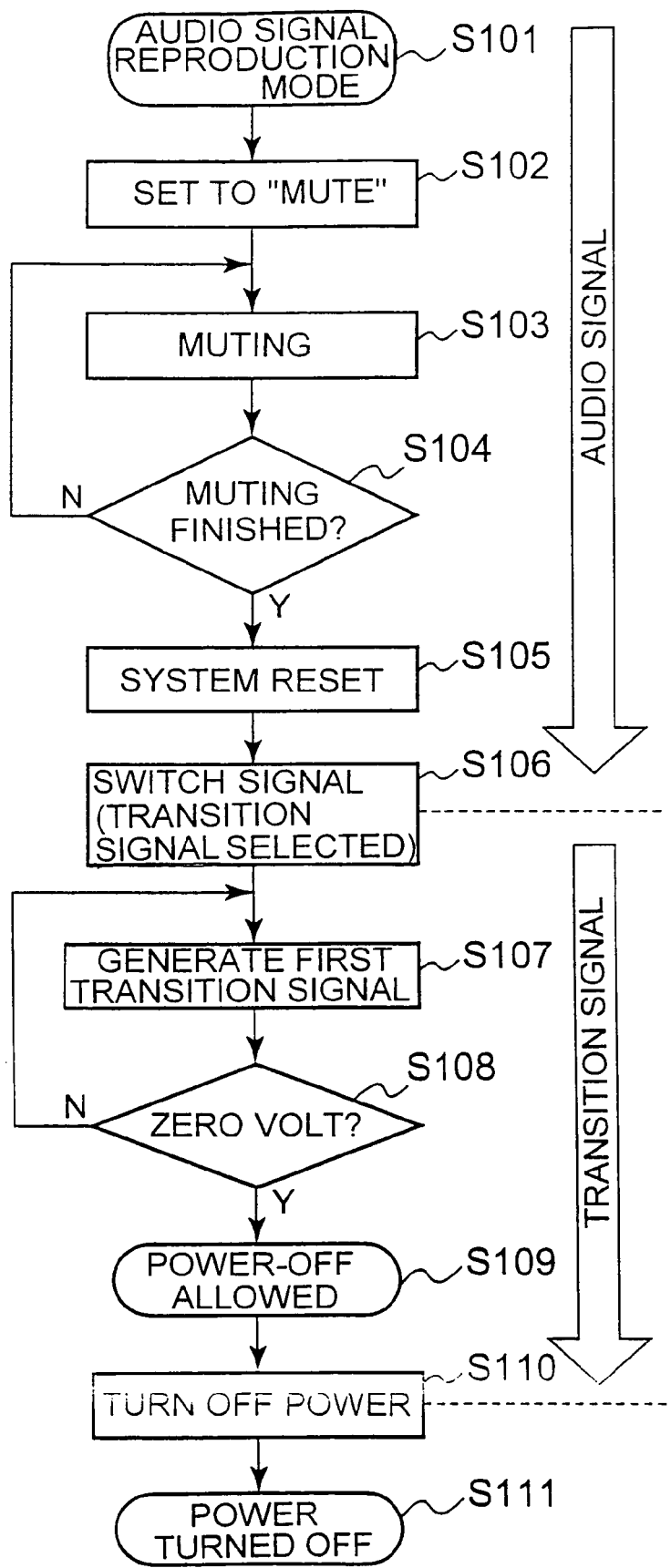
FIG. 9 shows a first flow chart illustrating a software implementation of an audio signal output circuit according to a fourth embodiment of the invention.
Figure 10:
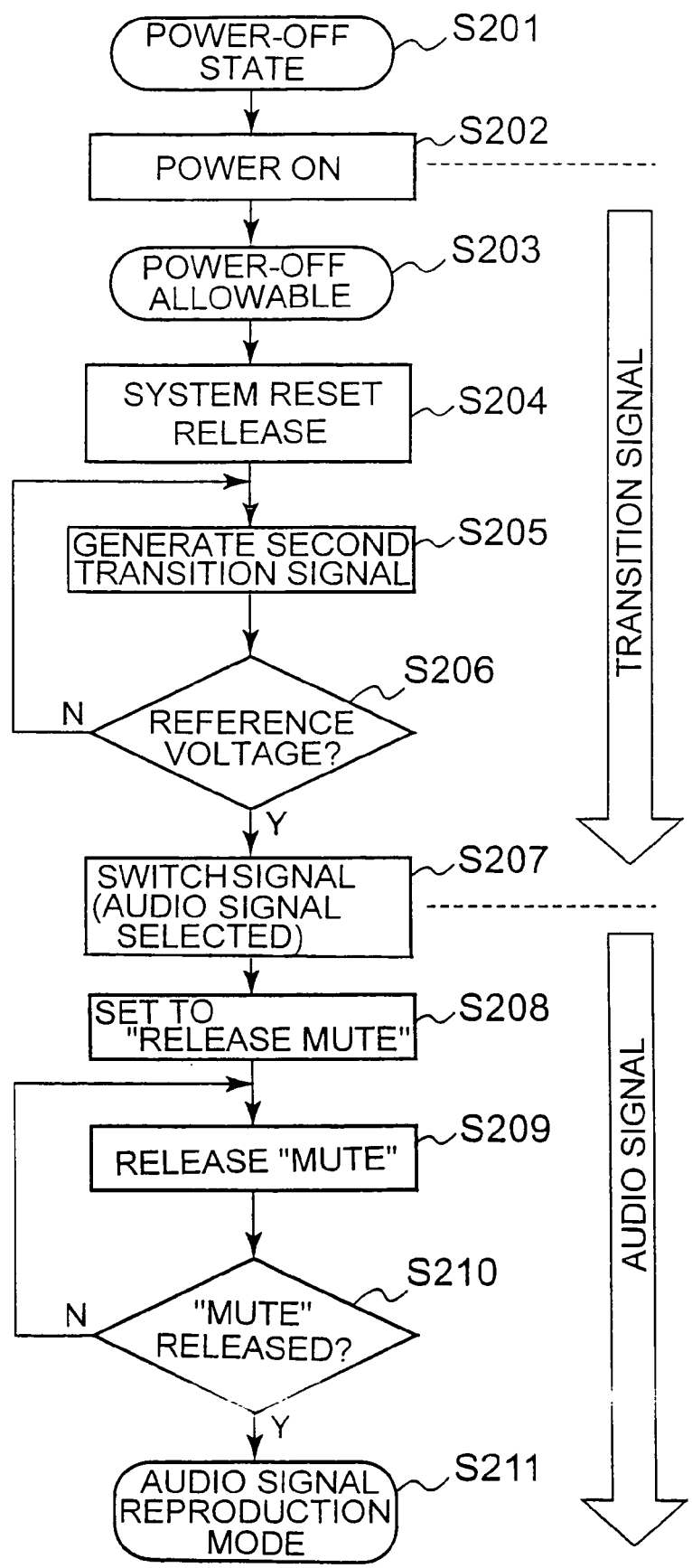
FIG. 10 shows a second flow chart illustrating a software implementation of an audio signal output circuit according to the fourth embodiment.

Referring to FIGS. 9 and 10, there is shown a flowchart illustrating procedures for implementing an inventive audio signal output circuit in software according to a fourth embodiment of the invention. In what follows we shall also refer to the software implementation as "audio signal output circuit". Particularly, FIG. 9 shows a procedure of changing an audio reproduction mode to the power-off mode. FIG. 10 shows a procedure of changing the power-off mode to an audio reproduction mode. In these two procedures, signals are processed with timings similar to those shown in FIGS. 2, 6, and 8. The audio signal is supplied to the speaker circuits (including LPFs 71-74 and speakers 81 and 82) as shown in FIGS. 1, 5, and 7.

As seen in FIG. 9, in an audio reproduction mode (step S101), a digital audio signal containing an AC component superposed on a reference voltage VREF is inputted, and the AC component is outputted as an audio output signal.

Mute processing (S103) is started when the mute/release mute signal MUT is set to "MUTING" state in step S102. In the mute processing, the amplification rate for the AC component of the input audio signal is decreased by a predetermined amount (or predetermined rate). In step S104, a determination is made as to whether the AC component has become (substantially) zero volt. This determination may be made by monitoring either the AC component itself or the amplification rate. Steps S103 and step S104 will be repeated until the AC component decreases to zero volt.

When the AC component is determined to have decreased to zero volt, a system reset is executed by generating a reset signal RES in step S105, and the ongoing output signal is switched from the audio signal (DSL, DSR) to the transition signal TRS. At this point, the transition signal TRS has the reference voltage VREF.

Subsequent to the switching to the transition signal TRS, the transition signal TRS is cast into a first transition signal that will smoothly decrease from the reference voltage VREF to zero volt.

In step S107, the transition signal TRS is decreased in level by a predetermined magnitude (or predetermined rate), and in step S108 a determination is made as to whether the transition signal TRS has decreased to zero volt or not. Steps S107 and step S108 will be repeated until the transition signal TRS reaches zero volt. The first transition signal smoothly decreases to zero volt in a time interval 21 (from time t2 to t3), in the same manner as in the first embodiment of FIG. 1 and shown in FIG. 2, and in the second and third embodiments of FIGS. 5 and 7 and shown in FIGS. 6 and 8.

A determination is made as to whether the transition signal TRS has became zero in step S108, and if it has, the audio signal output circuit is in the state where power may be turned off (step S109). Then, the power to the circuit is turned off in step S110. This power-off mode will be sustained (step S111).

FIG. 10 shows a power-on procedure to turn on power (step S102) to the audio signal output circuit in a power-off mode (step S201). At the time when power is turned on, the transition signal TRS is still selected in the output circuit. The transition signal TRS still has zero volt. Therefore, the audio output circuit is now in such a condition that the circuit can be shut down without generating pop noise (step S203).

As the system reset is released (step S204), that is, the reset signal RES is "RELEASED", a second transition signal TRS is generated, which smoothly increase from zero volt to the reference voltage VREF.

The second transition signal TRS is increased in level by a predetermined magnitude in step S205. The transition signal TRS is tested in step S206 to see if it has the reference voltage VREF. Steps S205-S206 will be repeated until the second transition signal TRS acquires the reference voltage VREF. As in the first embodiment of FIGS. 1 and 2, and in the second and third embodiments of FIGS. 5-8, this second transition signal smoothly increases over a time interval 23 (t4-t5).

When a determination is made that the transition signal TRS has acquired the reference voltage VREF (step S206), the ongoing output signal, which is currently the second transition signal TRS, is switched to the audio signals DSL and DSR in step S207. At this point, the audio signals (DSL and DSR) have the reference voltage VREF with zero-volt AC component.

As the mute/release mute signal MUT is set to "RELEASE MUTE" state in step S208, a procedure for releasing mute (referred to as release mute processing) is executed (S209). In the release mute processing of step S209, the amplification rate for the AC component of the input audio signal is incremented by a predetermined magnitude. In step S210, a determination is made as to whether the release mute processing has ended. This can be done by checking, for example, the amplification rate of the amplifier of interest. Steps S209 and S210 will be repeated until the release mute processing is completed.

After the release mute processing, the transition mode is switched to the audio reproduction mode (step S211). Meanwhile, pop noise is suppressed.

As described above and shown in FIGS. 9 and 10, processing of audio output signals of an inventive audio signal output circuit and of an inventive electronic apparatus can be executed by software, using a general purpose computer for example mounted on the electronic apparatus, which facilitates simplification in structure of the electronic apparatus.

What we claim is:

1. An audio signal output circuit, comprising:
   a volume setting circuit arranged to receive a digital input audio signal including an AC component superposed on a given reference voltage, said volume setting circuit adapted to amplify said AC component with an amplification rate that varies from a predetermined level to zero, or from zero to the predetermined level, in accordance with a received mute/release mute signal, with said given reference voltage kept constant;
   a modulator arranged to perform pulse density modulation on the audio signal received from the volume setting circuit;
   a transition signal generation circuit arranged to generate a pulse-density-modulated transition signal in response to a reset signal associated with said mute/release mute signal, said transition signal varying in level from said reference voltage to zero volt or from zero volt to said reference voltage;
   a switching circuit connected to said modulator and said transition signal generation circuit and arranged to receive an audio signal and a transition signal, respectively, from said modulator, said switch circuit adapted to selectively output one of said audio signal and said transition signal according to a switching signal received to an electro-acoustic transducing apparatus; and
   a control circuit arranged to generate a control signal that includes said mute/release mute signal, said reset signal, and said switching signal, wherein
   in switching said audio signal output circuit from a sound reproducing mode to a power-off mode or a mute mode, said switching circuit is switched to said transition signal having said reference voltage after said output level of said audio signal of said modulator is varied to said reference voltage, and then the level of said transition signal is varied from said reference voltage towards zero volt; while
   in switching said audio signal output circuit from the power-off mode or the mute mode to the sound reproducing mode, the output level of said transition signal is varied from zero volt to said reference voltage, and then said switching circuit is switched from said transition signal received from said transition signal generation circuit to said audio signal including said reference voltage.

2. The audio signal output circuit according to claim 1, wherein
   said electro-acoustic transducing apparatus includes a first electro-acoustic transducer and a second electro-acoustic transducer;
   said modulator is adapted to output a first pulse-density-modulated audio signal and a second pulse-density-modulated audio signal; and
   said switching circuit includes:
   a first switch arranged to select either one of said first audio signal and the transition signal received from said transition signal generation circuit, according to the switching signal received, and to feed the selected signal to a first electro-acoustic transducer, and
   a second switch arranged to select either one of said second audio signal and the transition signal received from said transition signal generation circuit, according to the switching signal received, and to feed the selected signal to a second electro-acoustic transducer.

3. The audio signal output circuit according to claim 1, wherein
said electro-acoustic transducing apparatus includes at least one electro-acoustic transducer;
said switching circuit includes:
  a first switch arranged to select either one of the audio signal received from said modulator and the transition signal received from said transition signal generation circuit, according to the switching signal received, and to feed the selected signal to one end of said at least one electro-acoustic transducer; and
  a second switch arranged to select either one of the inverted audio signal obtained by inverting said audio signal and the transition signal received from said transition signal generation circuit, according to the switching signal received, and to feed the selected signal to the other end of said at least one electro-acoustic transducer.

4. The audio signal output circuit according to claim 1, wherein
said electro-acoustic transducing apparatus includes a first electro-acoustic transducer and a second electro-acoustic transducer;
said modulator is adapted to output a first pulse-density-modulated audio signal and a second pulse-density-modulated audio signal; and
said switching circuit includes:
  a first switch arranged to select either one of said first pulse-density-modulated audio signal and the transition signal received from said transition signal generation circuit, according to the switching signal received, and to feed the selected signal to one end of said first electro-acoustic transducer,
  a third switch arranged to select either one of a third pulse-density-modulated audio signal obtained by inverting said first pulse-density-modulated audio signal and the transition signal received from said transition signal generation circuit, according to the switching signal received, and to feed the selected pulse-density-modulated signal to the other end of said first electro-acoustic transducer,
  a second switch arranged to select either one of said second pulse-density-modulated audio signal and the transition signal received from said transition signal generation circuit, according to the switching signal received, and to feed the selected signal to one end of said second electro-acoustic transducer, and
  a fourth switch arranged to select either one of a fourth pulse-density-modulated audio signal obtained by inverting said second pulse-density-modulated audio signal and the transition signal received from said transition signal generation circuit, according to the switching signal received, and to feed the selected signal to the other end of said second electro-acoustic transducer.

5. The audio signal output circuit according to claim 1, wherein
said electro-acoustic transducing apparatus includes a first electro-acoustic transducer and a second electro-acoustic transducer;
said modulator is adapted to output a first pulse-density-modulated audio signal and a second pulse-density-modulated audio signal;
said switching circuit includes:
  a first switch arranged to select either one of said first pulse-density-modulated audio signal and the transition signal received from said transition signal generation circuit, according to the switching signal received, and to feed the selected signal to one end of the first electro-acoustic transducer, and
  a second switch arranged to select either one of said second pulse-density-modulated audio signal and the transition signals received from said transition signal generation circuit, according to the switching signal received, and to feed the selected signal to one end of the second electro-acoustic transducer, wherein
said transition signal is supplied from the transition signal generation circuit to a serial node between said first electro-acoustic transducer and said second electro-acoustic transducer.

6. The audio signal output circuit according to claim 1 or 2, wherein said transition signal generation circuit includes:
  a transition wave form generation circuit arranged to generate a digitized wave form that varies in magnitude from a reference voltage to zero volt, or from zero volt to said reference voltage, and
  a transition signal pulse-density modulator arranged to convert the digital signal received from said transition signal wave form generation circuit into a pulse-density-modulated transition signal.

7. The audio signal output circuit according to claim 1 or 2, wherein
said transition signal generation circuit includes a memory arranged to store a wave form that varies in magnitude from said reference voltage to zero volt, or from zero volt to said reference voltage, said wave form stored in said memory and being available as a pulse-density-modulated transition signal.

8. An electronic apparatus, comprising:
an audio signal output circuit according to claim 1; and
an electro-acoustic transducing apparatus that includes a first electro-acoustic transducer and/or a second electro-acoustic transducer each connected to the output end of said audio signal output circuit directly or indirectly via a low-pass filter.

9. An electronic apparatus, comprising:
an audio signal output circuit arranged to receive a digital input audio signal including an AC component superposed on a DC component (reference voltage); and
an electro-acoustic transducing apparatus that includes a first electro-acoustic transducer and/or a second electro-acoustic transducer each connected to the output end of said audio signal output circuit directly or indirectly via a low-pass filter, wherein said audio signal output circuit includes:
  a muting device arranged to execute muting in response to a mute/release mute signal, in which the amplification rate of said audio signal output circuit for said AC component is decreased from a predetermined level to zero in accord with a given mute setting, with said DC component kept constant;
  a switch device arranged to execute system-reset and to switch the output of said audio signal output circuit from said input audio signal to a transition signal including said DC component when said muting is completed and the level of said AC component is detected to have reached to zero volt;
  a first transition signal generation device arranged to generate a transition signal that decreases in level from said reference voltage to zero volt; and
  a power-off device arranged to turn off power to said audio signal output circuit when generation of said transition signal is completed and the level of said transition signal is detected to have reached to zero volt, and whereby each of the muting device, the switch device, the first transition signal generation device, and the power-off device are arranged to be sequentially operated to make a transition from an audio signal reproducing mode to the power-off mode while suppressing pop noise.

10. An electronic apparatus, comprising:

an audio signal output circuit arranged to receive a digital input audio signal including an AC component superposed on a DC component (reference voltage); and an electro-acoustic transducing apparatus that includes a first electro-acoustic transducer and/or a second electro-acoustic transducer each connected to the output end of said audio signal output circuit directly or indirectly via a low-pass filter, wherein said audio signal output circuit includes:
  a transition signal enabling device arranged to feed power to said audio signal output circuit in power-off mode to output a transition signal of zero volt;
  a system-reset release device arranged to release the system-reset of said apparatus prior to feeding power;
  a second transition signal generation device arranged to generate a transition signal that increases in level from zero volt to said reference voltage;
  a switch device arranged to switch the output of said audio signal output circuit from said transition signal including said DC component to a muted audio signal when generation of said second transition signal is completed and said transition signal is detected to have reached said DC component; and
  a release mute device arranged to set said audio signal output circuit to release mute mode after switching the output of said circuit to an audio signal, in which mode the mode amplification rate of said audio signal output circuit for said AC component is increased from zero to a predetermined value, with said DC component kept constant, whereby each of the transition signal enabling device, the system-reset release device, the second transition signal generation device, the switch device, and the release mute device are sequentially operated to make a transition from an audio signal reproducing mode to the power-off mode while suppressing pop noise.

* * * * *